US006420775B1

(12) United States Patent
Asai

(10) Patent No.: US 6,420,775 B1
(45) Date of Patent: *Jul. 16, 2002

(54) COMPOUND SEMICONDUCTOR DEVICE HAVING AN ION IMPLANTED DEFECT-RICH LAYER FOR IMPROVED BACKGATE EFFECT SUPPRESSION

(75) Inventor: Shuji Asai, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/806,985

(22) Filed: Feb. 26, 1997

(30) Foreign Application Priority Data

Feb. 29, 1996 (JP) .............................. 8-042400

(51) Int. Cl.[7] ....................... H01L 29/30; H01L 29/167; H01L 29/207; H01L 29/227
(52) U.S. Cl. ....................... 257/617; 257/609; 257/610; 438/407
(58) Field of Search ................................ 257/617, 609, 257/610; 438/407

(56) References Cited

U.S. PATENT DOCUMENTS 5,225,707 A * 7/1993 Komaru et al. ............. 257/513

FOREIGN PATENT DOCUMENTS

| JP | 63-48869 | 3/1988 | |
| JP | 3-3336 | 1/1991 | |
| JP | 4-49627 | 2/1992 | |
| JP | 06216137 A | * 8/1994 | |

OTHER PUBLICATIONS

Kobiki et al. Kokai No. 63–048869, PTO Translation No. 98–1329, 5 pp., Mar. 1, 1988.*
Kazior, T.E., "Isolation Implant Studies In GaAs", J. Electrochem. Soc., vol. 137, No. 7, pp. 2257–2260, Jul. 1990.*
Anolick et al., "Reduction of Alpha Radiation Impact on CCD Memories", IBM Technical Disclosure Bulletin, vol. 22, No. 6, p.2355, Nov. 1979.*
Michael Shur, "GaAs Devices and Circuits", *Plenum Press*, New York, p. 435.
"Self–Aligned Submicron Gate Digital GaAs Integrated Circuits", *IEEE Electron Device Letters*, vol. EDL–4, No. 4, pp. 102–104.
"GaAs Element Separation Mechanism by Defects Formed by Implantation of B+ Ions", *Technical Report of IEICE* (*the Institute of Electronics Information and Communication Engineers*), vol. 91, No. 321, ED 91–119, pp. 19–24.
"Anomalies in MODFET's with a Low–Temperature Buffer", *IEEE, Transactions on Electron Devices*, vol. 37, No. 1, 1990, pp. 46–50.

* cited by examiner

*Primary Examiner*—Howard Weiss
(74) *Attorney, Agent, or Firm*—Young & Thompson

(57) ABSTRACT

A compound semiconductor device having improved backgate voltage resistance characteristics. To improve the backgate voltage resistance of a compound semiconductor device having field effect transistors on a main surface of a semi-insulating substrate, boron ions are implanted on the rear surface to form a defect-rich layer having carrier recombination centers.

7 Claims, 3 Drawing Sheets

COMPOUND SEMICONDUCTOR DEVICE HAVING AN ION IMPLANTED DEFECT-RICH LAYER FOR IMPROVED BACKGATE EFFECT SUPPRESSION

BACKGROUND OF THE INVENTION

1. Field of the Invention

The present invention relates to a compound semiconductor device such as an integrated circuit including a field effect transistor (FET), and more specifically, to a compound semiconductor device having improved resistance to a backgate effect from the surface of a substrate.

2. Description of the Related Art

A compound semiconductor typified by GaAs features higher electron mobility than that of Si and the development of compound semiconductor devices such as analog signal amplifier circuits having ultra-high-frequency elements such as an MES type field effect transistor, Schottky barrier diode or the like integrated thereon, logic gates, memories and the like is actively underway. However, for the implementation of these compound semiconductor devices, there are big problems to be solved such as a sidegate effect in which a potential difference between an element such as an FET on the front surface of a substrate and another element formed on the front surface of a substrate modulates the channel layer of that FET through the substrate and affects the element characteristics of the FET, for example, drain current. Another of such problems is a backgate effect which is caused by the potential difference between an element on the front surface of a substrate and an electrically grounded electrode on the back surface of the substrate.

FIG. 4 shows a differential amplifier circuit called "source coupled FET logic (SCFL)" which is often used in the digital or analog circuit of a compound semiconductor. This type of circuit is introduced on page 435 of "GaAs DEVICES AND CIRCUITS", Plenum Press (Michael Shur, New York and London), for example. In FIG. 4, reference numeral 51 denotes a MESFET; 52, a resistor; 53, a diode; 54, a positive power source terminal; 55, a negative power source terminal; 56, an input terminal; and 57, an output terminal. This type of circuit employing a Si bipolar transistor in place of the FET is called "emitter coupled logic (ECL)". Since both circuits operate at almost the same voltage and speed, they can be replaced with each other and selected according to the purpose of use and considering characteristics such as the steepness of the waveform of the circuit and power consumption, costs and the like.

To replace a Si bipolar device by a compound semiconductor device, it is necessary to match the shape of a circuit chip and the position of a bonding pad in order to use the same package. Generally speaking, since an ECL is grounded to a positive power source, a compound semiconductor device may be designed to be grounded not only to a negative power source but also to a positive power source in order to replace an Si bipolar device. That is, as shown in FIG. 2, the rear surface of an ordinary chip is bonded to a metal carrier 14 of a package which serves both for heat radiation and electrical grounding using a solder material 13 having a low melting point. It is possible that the carrier 14 is connected to either the positive power terminal 54 or the negative power terminal 55 of the SCFL shown in FIG. 4. In either one of the grounding systems, the source of the MESFET 51 on the input side of the SCFL is at an intermediate potential and a sidegate effect or a backgate effect caused by the operation of the circuit becomes a problem to be solved.

In IEEE Electron Device Letters, Vol. EDL-4, No.4, pp. 102–103, "Self-Aligned Sub-micron Gate GaAs Integrated Circuits", an attempt to improve such a sidegate effect in a compound semiconductor device by implanting ions such as protons $H^+$, boron ions $B^+$ or oxygen ions $O^+$ to form a defective region between FET elements formed on a semi-insulating GaAs substrate is proposed. The principle that the sidegate effect is improved by this method is described in the Technical Report of IEICE (the Institute of Electronics Information and Communication Engineers), Vol.91, No.321, ED 91–119, pp.19–24, "GaAs Element Separation Mechanism by Defects Formed by Implantation of $B^+$ Ions".

However, since a defective region is formed only on the front surface of the substrate in this FET structure, it has no effect when the potential of the rear surface of the substrate varies. Further, when the total area of adjacent electrodes on the front surface of the substrate, for causing a sidegate effect, is much larger than that of the FET concerned, the effect of the defect region is weakened, whereby the amount of a field generated through a deep portion of the substrate increases and a backgate effect appears, thereby causing fluctuations in the characteristics of the FET.

Several proposals for forming a layer having a deep level under an FET channel layer have been made to improve backgate voltage resistance of the substrate side.

FIG. 5 is a sectional view of a semiconductor device (to be referred to as "first conventional example" hereinafter) proposed in IEEE, Transactions on Electron Devices, Vol.37, No.1, 1990, pp.46–50, "Anomalies in MODFET's with a Low-Temperature Buffer". In this conventional example, a low-temperature growth i-type GaAs layer 62, a normal-temperature growth i-type GaAs layer 63 and an n-type GaAs layer 64 are grown on a semi-insulating GaAs substrate 61 sequentially and a source electrode 66, a gate electrode 67, a drain electrode 68 and a sidegate 69 are formed on the n-type GaAs layer 64 to separate these elements by an ion implanted defect layer 65. The term "sidegate" as used herein defines an electrode adjacent to an affected FET (FET shown at the center of the figure) and having a sidegate effect on the FET and generally refers to the conductive region or electrode of an FET or diode.

The MBE growth of GaAs is generally carried out at around a temperature of 600° C. However, in this conventional example, part of a buffer layer (62) is formed at a growth temperature of 200 to 300° C. to generate defects (deep levels) in this layer with an excessive amount of arsenic (As).

As a second conventional example, as shown in FIG. 6, formation of a layer doped with deep level generating impurities by continuous epitaxial growth is proposed in Laid-open Japanese Patent Application (KOKAI) No. Hei 3-3336. In this conventional example, an i-type GaAs buffer layer 72, a 400-nm-thick Cr doped GaAs layer 73 having a Cr concentration of about $5 \times 10^{16}$ cm$^{-3}$ as an impurity for generating a deep level, a p-type GaAs layer 74 and an n-type GaAs layer 75 are epitaxially grown sequentially on a semi-insulating GaAs substrate 71, and a source electrode 76, a gate electrode 77 and a drain electrode 78 are formed on the n-type GaAs layer 75. Fe (iron), Ni (nickel) or oxygen may be used in place of Cr. An embodiment in which the Cr doped GaAs layer 73 is inserted between the semi-insulating GaAs substrate 71 and the i-type GaAs buffer layer 72 is shown in the document as well.

As a third conventional example, as shown in FIG. 7, the formation of an ion implanted defect layer 82 at a position deeper than an active layer in a semi-insulating GaAs substrate 81 is proposed in Laid-open Japanese Patent Application (KOKAI) No. Hei 4-49627. In this conventional example, after the ion implanted defect layer 82 is formed, silicon is selectively implanted to form an n-type GaAs layer 83 and a source electrode 84, a gate electrode 85 and a drain electrode 86 are formed on the n-type GaAs layer 83. Boron is selected as an impurity for forming the ion implanted defective layer 82 and implanted at 150 keV in an amount of $1 \times 10^{15}$ cm$^{-2}$ ions. Protons or oxygen ions may be implanted in place of boron ions.

As a fourth conventional example different from the above two, as shown in FIG, 8, the formation of an insulating film 92 between a semi-insulating GaAs substrate 91 and a rear-surface electrode 93 is proposed in Laid-open Japanese Patent Application (KOKAI) No. Sho 63-48869. An n-type GaAs layer 96 is formed on the front surface of the semi-insulating GaAs substrate 91 by ion implantation, and a source electrode 97, a gate electrode 98 and a drain electrode 99 are formed on the n-type GaAs layer 96. A rear-surface electrode 93 is soldered to a carrier 95 by a solder material 94. The purpose of forming the insulating film 92 is to improve withstand voltage and gain by suppressing a leak current into the substrate. As a material for the insulating film, SiN, SiO, SiON or the like may be employed.

In the first conventional example described above, since a low crystalline quality layer must be formed by low-temperature epitaxial growth, defects easily spread into the top layer, the electron mobility of the channel layer is reduced, and the characteristics of the FET deteriorate. In this conventional example, in order to obtain sufficient backgate resistance, it is necessary to reduce the epitaxial growth temperature and increase the thickness of a low-temperature epitaxial layer. Therefore, it is difficult to obtain an active layer having high carrier mobility and excellent crystallinity so that the characteristics of an FET such as $g_m$ and uniformity are unsatisfactory.

In the second conventional example, the carrier is excellent in mean free path (Debye length) and the effect of suppressing a backgate effect is small with a Cr concentration ($5 \times 10^{16}$ cm$^{-3}$) and a film thickness of 400 nm described as the embodiment. When the concentration of Cr is increased to improve the backgate effect resistance, the crystallinity deteriorates with the result that the same problem as in the first embodiment occurs and at the same time, a shallow level as well as defects are produced, thereby reducing resistivity disadvantageously. Also, when the thickness of the layer is increased, the growth time is prolonged, thereby reducing manufacturing productivity.

Further, in the third conventional example, since the acceleration energy of an ion implanter which is commonly used is about 200 keV, even boron ions that are light-weighted can be implanted to only a depth of 1 μm. Since the crystallinity of the substrate and the Debye length are recovered by a heat treatment for activating the channel layer, there is no effect of suppressing a backgate effect as in the second conventional example. If the temperature of such heat treatment is lowered, the activation of the channel layer is incomplete and the characteristics of an FET deteriorates. Although it is conceivable that boron ions may be implanted after the activation of the channel layer, a large number of defects are disadvantageously introduced into the active layer by this ion implantation as described in the document.

Finally, in the fourth conventional example, it is necessary to reduce the thickness of the inserted insulation film because of poor heat conductivity. However, when the thickness is reduced, the capacitance increases. A laminated structure of an insulating film and a semi-insulating substrate constitutes a serial body of a capacitor and a resistor. Because the capacitance of the insulating film is large, when the source potential of an FET which is at an intermediate level in the SCFL of FIG. 4 instantaneously makes a big shift to a positive value due to the operation of the circuit, a backgate effect is produced for an instance to decrease a channel current (drain current), thereby delaying the change of a source potential, as a change in the potential of the interface between the channel and the substance right under the gate is delayed by the capacitance of the insulating film. Therefore, the insertion of a dielectric film having high resistance under the surface of a substrate has no effect of improving backgate resistance.

SUMMARY OF THE INVENTION

It is therefore an object of the present invention to suppress a backgate effect without affecting an FET channel layer and reducing productivity.

The above object can be attained by forming a defect-rich defective layer (hereinafter called the "defect layer") on the rear surface of a semi-insulating substrate by ion implantation. The ion implantation induces crystalline defects capable of acting as carrier recombination centers in these defect layers.

A compound semiconductor device according to the present invention is characterized by comprising a field effect transistor element formed on the front surface of a semi-insulating semiconductor substrate and a defective layer formed on the rear surface of the semi-insulating semiconductor substrate by ion implantation.

Ions to be implanted to form the above defective layer are of B (boron), N (nitrogen), O (oxygen) or F (fluorine) ions.

The ability of the 1 μm thick defective layer formed by ion implantation as a recombination center is much higher than those of impurities contained in the crystals such as Cr, Fe, Ni and O which are present in the conventional examples. Therefore, holes injected into the semi-insulating substrate from a front-surface electrode which changes by the operation of the circuit can be eliminated at a high speed. When this defective layer is formed on the rear surface of the substrate, even if the source potential is changed, the potential of the interface between the channel and the substrate right under the gate is not pulled by the potential of the rear surface of the substrate, thereby suppressing a backgate effect. Further, since the holes accumulated in the substrate are eliminated at a high speed, pulse response is improved as well.

In the compound semiconductor device according to the present invention, ions are implanted into the entire rear surface of the substrate after an FET element is formed on the front surface of the substrate. Therefore, the number of additional steps is only one.

Further, when a deep level layer is formed under the channel layer of an FET as in the first to third conventional examples, the channel layer is affected by the deep level layer and the characteristics of the FET deteriorate. On the other hand, since ions are implanted onto the rear surface of the substrate in the present invention, they do not affect the characteristics of an FET on the front surface of the substrate.

It is further noted that the thickness of the substrate is generally reduced by polishing the rear surface thereof before a chip is obtained therefrom. Since the depth of damage caused by such mechanical polishing is much smaller than that of damage caused by charged particles of implanted ions because energy is much smaller and there is almost no ability as a recombination center.

BRIEF DESCRIPTION OF THE DRAWINGS

The above and other objects and advantages of the present invention will become clear from the following description with reference to the accompanying drawings, wherein.

DETAILED DESCRIPTION OF THE PREFERRED EMBODIMENTS

The preferred embodiments of the present invention are described hereinunder with reference to the accompanying drawings.

Embodiment 1

Figure 1:
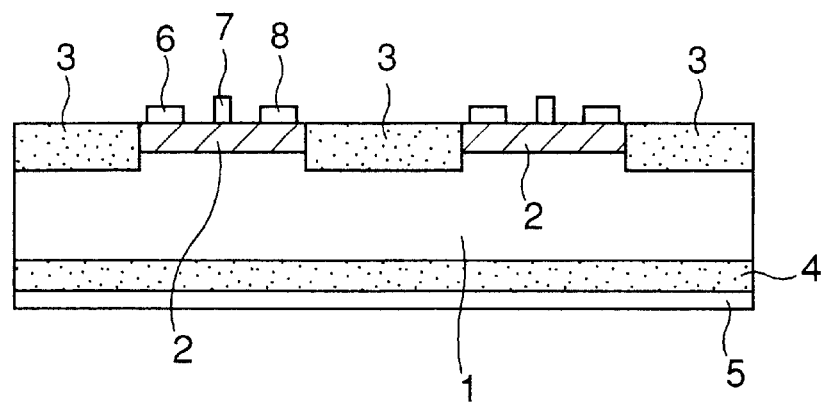
FIG. 1 is a sectional view of a first embodiment of the present invention.

FIG. 1 is a sectional view of a first embodiment of the present invention. As shown in the figure, on the front surface of a semi-insulating GaAs substrate 1, an n-type GaAs layer 2 is formed by the implantation of Si ions and a subsequent activation heat treatment at 800° C. On top of the n-type GaAs layer 2, a source electrode 6, a gate electrode 7 and a drain electrode 8 are formed. These elements are separated from one another by an element separation defect layer 3 formed by an implantation of boron ions ($B^+$). After the formation of the elements, the rear surface of the semi-insulating GaAs substrate 1 is polished to a thickness of 300 μm. Then, boron ions are implanted into the entire polished rear surface at an acceleration energy of 180 keV and to an implantation dose of $1 \times 10^{14}$ $cm^{-2}$ to form a rear-surface defect layer 4. A Ti-Au rear-surface electrode 5 (thickness: 20 nm, 300 nm) is formed on the surface of the rear-surface defect layer 4.

Figure 2:
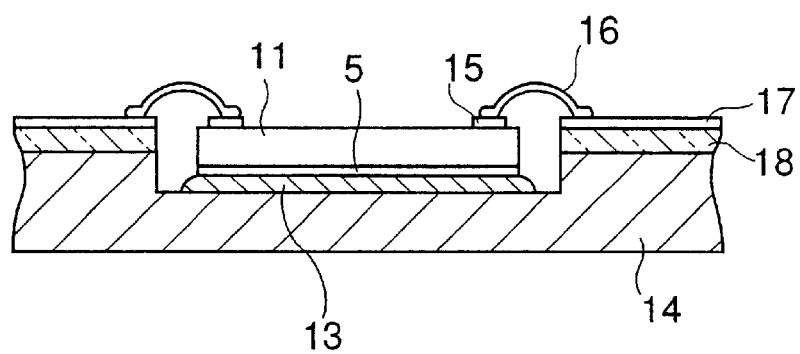
FIG. 2 is a sectional view showing the first embodiment of the present invention mounted on a package.

A description is subsequently given of a package fabrication method with reference to FIG. 2. A wafer is diced to prepare a chip 11 and the rear-surface electrode 5 of the chip 11 is fixed to an Au plating layer of a carrier 14 by a solder material 13 such as AuSn alloy. A pad 15 on the front surface of the chip and a terminal wire 17 formed on the front surface of a ceramic board 18 are connected by an Au wire 16.

The implantation dose of ions implanted into the rear surface of the substrate must be determined in consideration of the recovery of a defect by the heating temperature of the solder material. When the heating temperature of the solder material is 300 to 400° C., implantation dose of $1 \times 10^{13}$ to $1 \times 10^{15}$ $cm^{-2}$ is appropriate. Further, it is desirable that the acceleration energy is the maximum available of the ion injector so as to form defects deeply. When boron ions $B^+$ are implanted at 180 keV, the depth of a defect is about 1 μm.

As for the thickness of a defect layer 4, the state of a defect at each position is almost proportional to the amount of ions that passed through. The amount of ions passed at each point is obtained by integrating an LSS distribution (similar to a normal distribution) from infinity, and the state of a defect is expressed by such a distribution that the amount of passed ions decreases from the front surface by an exponential function. The thickness of the defective layer can be roughly estimated to be double or triple the peak depth Rp of the LSS distribution.

As for type of ions, ions having a smaller mass can be implanted deeper. However, since damage caused by protons ($H^+$) or alpha-ray ($He^+$) is recovered quickly by a heat treatment at 500° C. or so, these ions are not desirable. This is considered to be because these ions having a small mass have little physical effect on Ga and As having a large mass. Be and C are not preferred because they are activated into a p type at 500 to 600° C. Therefore, useful elements are B (boron), N (nitrogen), O (oxygen), F (fluorine) and the like. The implantation dose suitable for each of these elements is the same as that of boron, because they have almost the same mass.

For comparison, the backgate characteristic of a compound semiconductor device having a common single FET element on the front surface and no defective layer on the rear surface was measured. The backgate voltage (backgate voltage resistance: voltage applied to the rear surface of a substrate) at which the drain current measured with the backgate voltage of the rear-surface electrode at 0 V reduces by 10% was about −3.0 V while a drain voltage of +5.0 V was applied to an element having a gate threshold voltage Vt of −1.0 V. On the other hand, in the case of this embodiment, the backgate voltage resistance was improved to −10 to −12 V or so.

A pulse amplifier circuit formed of an SCFL was fabricated in a form of a package and characterized. At a power voltage of 5.0 V, a 1.0 Vp-p signal whose mark rate changes from ⅛ to ⅞ at random for 1 ns. was applied as an input signal. When there was no defective layer on the rear surface, there was a change in mark response (rise, steepness of a rising waveform) by grounding the potential of the rear surface to a positive power source or negative power source. When grounded to the positive side, although response might be fast, there was a big difference in response according to mark rate. When grounded to the negative side, although response was a little slow, there was a small difference in response according to mark rate. In the embodiment of the present invention where a defective layer was formed, there was little difference in response regardless of the potential type of the rear surface. Fluctuations in response caused by mark rate variations were improved, and response was fast.

The reason why the device without the rear surface defect layer showed the above characteristics is considered to be as follows. When the rear surface having no defect layer is given the negative potential, while the response becomes slow because the mutual conductance $g_m$ decreases during backgate effect is produced, the dependence thereof on mark rate is reduced because the potential at the interface between the channel and the substrate fluctuates less in response to holes from the element itself or from other elements than when the rear surface is given a positive potential and the potential of the interface between the channel and the substrate tend to follow the potential of the rear surface. In the case of the present invention in which a defective layer is formed on the rear surface of the substrate, it is considered that dependence on mark rate is reduced while high $g_m$ is maintained because although changes in the surface electrode may occur, holes charged in the semi-insulating substrate are quickly eliminated and the potential at the interface between the channel and the substrate rarely fluctuates in response.

For comparison with the fourth conventional example, a sample was prepared by forming a 200-nm-thick SiN film on the rear surface of a 300-μm-thick substrate having no rear-surface defective layer by a plasma CVD method and then forming a rear-surface electrode on the SiN film. When the potential of the rear surface was changed from 0 V to −5 V in pulse while a drain current having a voltage of +5.0 V ran through a single FET, a reduction in drain current was seen for a several milliseconds. On the other hand, in the case of the embodiment of the present invention where a defect layer was formed on the rear surface, although there was a small noise in the order of μsec through a measuring system, any change which lasted several milliseconds was not seen.

Embodiment 2

Figure 3:
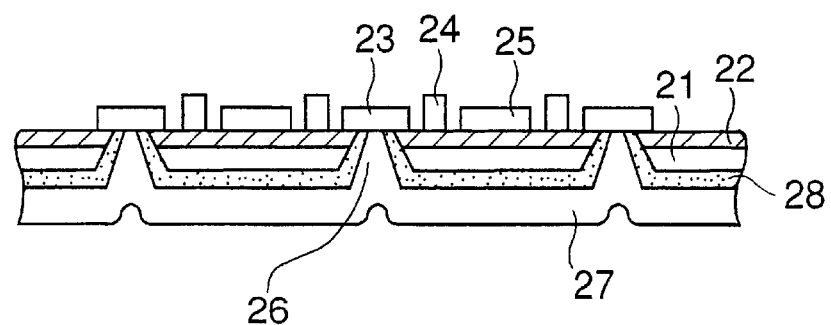
FIG. 3 is a sectional view of a second embodiment of the present invention.
Figure 4:
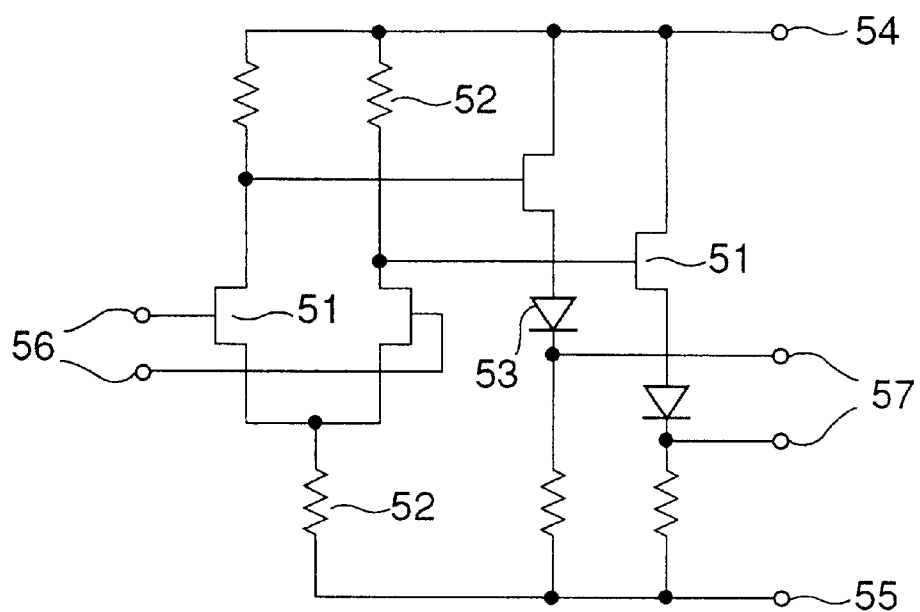
FIG. 4 is a circuit diagram for explaining the problems of the conventional example.
Figure 5:
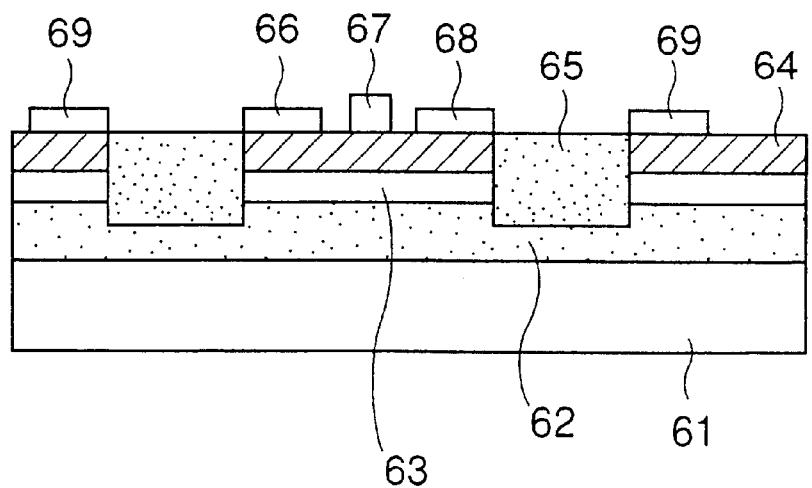
FIG. 5 is a sectional view of a first conventional example.
Figure 6:
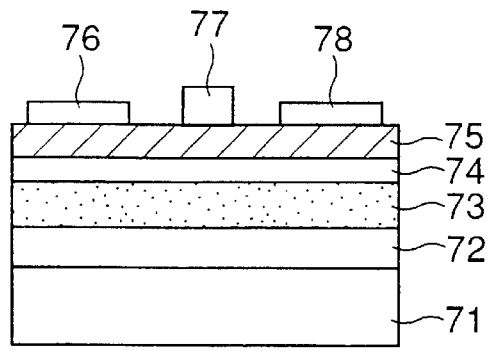
FIG. 6 is a sectional view of a second conventional example.
Figure 7:
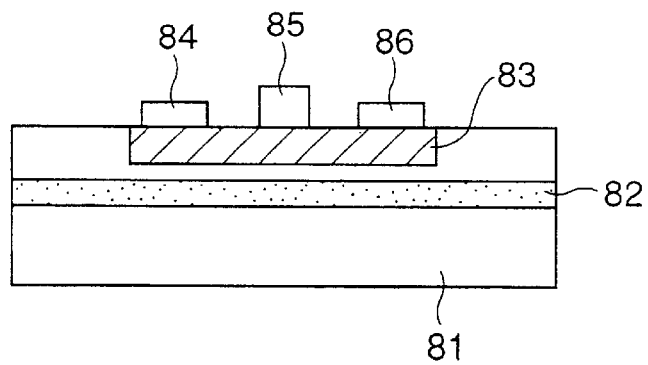
FIG. 7 is a sectional view of a third conventional example.
Figure 8:
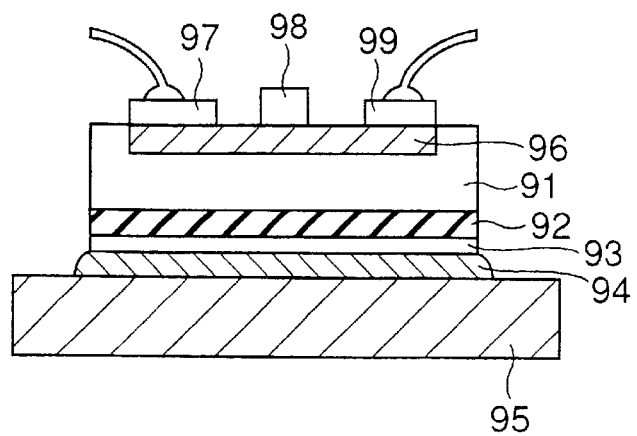
FIG. 8 is a sectional view of a fourth conventional example.

FIG. 3 is a sectional view of a second embodiment of the present invention. This embodiment relates to a case where the present invention is applied to a high-output FET. In the high-output FET, the thickness of a semi-insulating GaAs substrate 21 is reduced to about 30 μm to increase heat radiation, a via hole 26 is formed from the rear surface of the substrate at a position corresponding to a source electrode 23 in order to reduce source inductance, and an Au plating layer is formed to fill the inside of the via hole as a rear-surface electrode 27 to ground the element electrode 23 (for example, "The Basis of GaAs FET" published by the Institute of Electronics Information and Communication Engineers, pp.213).

First, an n-type GaAs layer 22 is formed on the semi-insulating GaAs substrate 21 by an ion implantation method and a source electrode 23, a gate electrode 24 and a drain electrode 25 are formed on the n-type GaAs layer 22. Thereafter, the substrate is polished to a thickness of 30 μm as described above. Then, a via hole 26 reaching from the rear surface of the substrate to the bottom side of the source electrode (the interface between the source electrode and the n-type GaAs layer 2) is formed under the source electrode. Boron ions B$^+$ are implanted into the rear surface to form a rear-surface defect layer 28. The conditions of this ion implantation are the same as those of the first embodiment. Even if ions implanted from the rear surface strike against the rear surface on which the electrode is to be formed, a conductivity failure is eliminated by cleaning with Ar plasma before an initial layer for the rear-surface electrode 27 is formed by sputter deposition.

In this way, the steepness of waveform change is improved in the amplification of a pulse having a large amplitude when a defective layer is formed on the rear surface. It is considered that the elimination of holes accumulated in the semi-insulating GaAs substrate effectively contributes to this. This embodiment is useful as a 5 Vp-p output device for driving an optical modulator for optical communication, for example.

While preferred embodiments of the present invention have been described above, it is to be understood that the present invention is not limited to these embodiments and various changes and modifications may be made without departing from the spirit or scope of the appended claims. For example, although the channel layer has been formed by an ion implantation method in the embodiments, it may be formed by an epitaxial growth method, or a channel making use of a secondary electron gas such as AlGaAs/InGaAs may be used in place of the n-type GaAs layer. As the conductive material for fixing a chip may be used a conductive adhesive material in addition to a metal solder having a low melting point.

As described on the foregoing pages, since the compound semiconductor device of the present invention is prepared by forming a defect rich layer on the rear surface of a semi-insulating substrate by an ion implantation method, it can suppress a backgate effect and improve pulse response against fluctuations in mark rate. This effect can be obtained by adding only one step after the formation of an element. Further, since this additional step is for the rear surface of the substrate, an adverse effect on an FET element present on the front surface of the substrate can be prevented.

What is claimed is:

1. A compound semiconductor device comprising:
   a semi-insulating substrate and an n-type channel layer directly on a front surface thereof;
   a field effect transistor element on said n-type channel layer;
   an electrode on a rear surface of said substrate; and
   a defect layer on a rear surface of said substrate and in contact with said electrode, said defect layer being produced by ion implantation into said rear surface of said substrate, said ion implantation generating crystal defects in said defect layer that serve to eliminate holes accumulated in said semi-insulating semiconductor substrate.

2. The compound semiconductor device as claimed in claim 1, wherein said field effect transistor element comprises a gate electrode, a source electrode and a drain electrode, said gate, source and drain electrodes directly on a channel layer on said front surface of said substrate.

3. The compound semiconductor device as claimed in claim 1, comprising at least two of said field effect transistor element that are separated from one another by a defect layer on the front surface of the substrate.

4. The compound semiconductor device as claimed in claim 1, wherein said defect layer comprises ions of an impurity selected from the group consisting of boron, nitrogen, oxygen, and fluorine.

5. The compound semiconductor device as claimed in claim 1, wherein said defect layer on the rear surface is 1 micrometer thick.

6. The compound semiconductor device as claimed in claim 1, further comprising an electrode between said defect layer on the rear surface and a solder material affixing said electrode to a further electrode on a package.

7. A compound semiconductor device comprising:
   a semi-insulating substrate and an n-type channel layer directly on a front surface thereof;
   a plurality of field effect transistor elements that each have a gate electrode, a source electrode and a drain electrode all directly on said n-type channel layer;
   a plurality of via holes through the thickness of the substrate, said via holes each having a sidewall and a bottom, a depth of said bottom reaching from a rear surface of said substrate to a corresponding one of said source electrodes;
   a defect-rich semiconductor layer having recombination centers covering said rear surface of said substrate and said sidewalls of said via holes; and
   a rear surface electrode covering said defect-rich semiconductor layer and said source electrodes exposed at the bottom of said via holes to electrically connect said source electrodes, said defect-rich semiconductor layer being produced by ion implantation into said rear surface of said substrate, said ion implantation generating crystal defects in said defect-rich layer that serve to eliminate holes accumulated in said semi-insulating semiconductor substrate.

* * * * *